United States Patent
Li et al.

(10) Patent No.: US 12,016,215 B2
(45) Date of Patent: Jun. 18, 2024

(54) DISPLAY SUBSTRATE AND AMOLED DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Shaoru Li, Beijing (CN); Rui Wang, Beijing (CN); Ni Yang, Beijing (CN); Hailong Wu, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 1000 days.

(21) Appl. No.: 16/964,331

(22) PCT Filed: Oct. 14, 2019

(86) PCT No.: PCT/CN2019/111101
§ 371 (c)(1),
(2) Date: Jul. 23, 2020

(87) PCT Pub. No.: WO2021/072606
PCT Pub. Date: Apr. 22, 2021

(65) Prior Publication Data
US 2023/0157092 A1    May 18, 2023

(51) Int. Cl.
*H10K 59/131*    (2023.01)

(52) U.S. Cl.
CPC ................... *H10K 59/131* (2023.02)

(58) Field of Classification Search
None
See application file for complete search history.

(56) References Cited

U.S. PATENT DOCUMENTS 9,659,525 B2     5/2017  In et al.
9,837,628 B2 *  12/2017  Ma ..................... H10K 59/179
(Continued)

FOREIGN PATENT DOCUMENTS

CN    101561992 A    10/2009
CN    101889358 A    11/2010
(Continued)

OTHER PUBLICATIONS

China Patent Office, First Office Action dated May 7, 2022, for corresponding Chinese application 201980001948.X.

*Primary Examiner* — Hung K Vu
(74) *Attorney, Agent, or Firm* — HOUTTEMAN LAW LLC

(57) ABSTRACT

The disclosure provides a display substrate and an AMOLED display device. The display substrate includes a display area including multiple pixel units in an array, each row is correspondingly provided with a first power line, and each column is correspondingly provided with a second power line; the multiple pixel units are divided into first pixel units and second pixel units; each row includes at least one first pixel unit, in which the driving transistor is electrically coupled to the second power line corresponding to the column of the first pixel unit; for at least one column of pixel units, each column includes at least one second pixel unit; in which the driving transistor is electrically coupled, through the first power line corresponding to the row of the second pixel unit, to the second power line corresponding to the column of one first pixel unit in the row.

15 Claims, 9 Drawing Sheets

(56) References Cited

U.S. PATENT DOCUMENTS

| | | |
|---|---|---|
| 2009/0262046 A1 | 10/2009 | Nathan et al. |
| 2009/0262258 A1 | 10/2009 | Taneda et al. |
| 2013/0285996 A1 | 10/2013 | Lee et al. |
| 2014/0184579 A1 | 7/2014 | Kim et al. |
| 2014/0339508 A1* | 11/2014 | Hong ................... H10K 59/123 |
| | | 257/40 |
| 2015/0170574 A1 | 6/2015 | Kim |
| 2018/0301518 A1 | 10/2018 | Zhu et al. |
| 2019/0066561 A1 | 2/2019 | Yuan et al. |
| 2019/0385531 A1* | 12/2019 | Jin ....................... G09G 3/3208 |
| 2021/0225996 A1 | 7/2021 | Yu et al. |

FOREIGN PATENT DOCUMENTS

| | | |
|---|---|---|
| CN | 102916037 A | 2/2013 |
| CN | 103377593 A | 10/2013 |
| CN | 103903558 A | 7/2014 |
| CN | 103927977 A | 7/2014 |
| CN | 105679795 A | 6/2016 |
| CN | 106128359 A | 11/2016 |
| CN | 106875888 A | 6/2017 |
| CN | 107331338 A | 11/2017 |
| CN | 108269534 A | 7/2018 |
| CN | 109254462 A | 1/2019 |
| CN | 110249430 A | 9/2019 |

\* cited by examiner

DISPLAY SUBSTRATE AND AMOLED DISPLAY DEVICE

CROSS-REFERENCE TO RELATED APPLICATION

This application is a National Phase Application filed under 35 U.S.C. 371 as a national stage of PCT/CN2019/111101, filed on Oct. 14, 2019, the contents of which are incorporated herein by reference in their entirety.

TECHNICAL FIELD

Embodiments of the present disclosure relate to the field of display technology, and particularly, to a display substrate, and an AMOLED display device.

BACKGROUND

An Organic Light-Emitting Diode (OLED) display device is an active light-emitting device, has the advantages of high contrast, wide viewing angle, low power consumption, fast response speed, thinner volume, and the like, and is expected to become the mainstream flat panel display technology of the next generation. OLED display devices can be classified, according to driving methods thereof, into two types: passive matrix OLED (PMOLED) display devices and active matrix OLED (AMOLED) display devices. An AMOLED display device has pixel units arranged in an array, belongs to the active display type, has high light emitting efficiency, and is generally used as a large-sized display device with high definition.

Currently, in the AMOLED display device, IR drop phenomenon usually occurs in a process of supplying a power supply voltage (VDD) to each pixel, which causes a variation in a driving current of the AMOLED display device, and leads to a non-uniform display brightness of the display device. And the larger the size of the AMOLED display device is, the more serious the IR drop phenomenon is, and the larger the difference in brightness is.

Therefore, how to alleviate the IR drop phenomenon of the AMOLED display device becomes a technical problem to be solved.

SUMMARY

Embodiments of the present disclosure are directed to at least one of the technical problems in the prior art, and provide a display substrate and an AMOLED display device.

In a first aspect, an embodiment of the present disclosure provides a display substrate, including a display area, wherein the display area includes a plurality of pixel units arranged in an array, each of the plurality of pixel units includes a driving transistor, each row of pixel units is correspondingly provided with a first power line, and each column of pixel units is correspondingly provided with a second power line; a first power bus is provided on one side of the display area in an extending direction of the second power line, and one end of the second power line is coupled to the first power bus; the plurality of pixel units are divided into a first pixel unit and a second pixel unit;

each row of pixel units includes at least one first pixel unit; the driving transistor in the first pixel unit is electrically coupled to the second power line corresponding to a column in which the first pixel unit is located; and for at least one column of pixel units, each column of pixel units includes at least one second pixel unit; the driving transistor in the second pixel unit is electrically coupled, through the first power line corresponding to a row in which the second pixel unit is located, to the second power line corresponding to a column in which any one first pixel unit in the same row as the second pixel unit is located.

In some embodiments, in the first pixel unit, an active layer of the driving transistor is electrically coupled to the second power line corresponding to the column in which the first pixel unit is located.

In some embodiments, in the second pixel unit, an active layer of the driving transistor is electrically coupled, through the first power line corresponding to the row in which the second pixel unit is located, to the second power line corresponding to the column in which any one first pixel unit in the same row as the second pixel unit is located.

In some embodiments, the display area includes a plurality of display sub-areas arranged in an array, and each of the plurality of display sub-areas includes at least one first pixel unit.

In some embodiments, each of the plurality of display sub-areas includes a plurality of first pixel units, and the plurality of first pixel units located in a same display sub-area are located in a same column.

In some embodiments, a number of the plurality of first pixel units in each of the plurality of display sub-areas is the same.

In some embodiments, the first pixel units in different display sub-areas are located in different columns.

In some embodiments, the display area includes at least two display sub-areas, and the at least two display sub-areas are disposed along the extending direction of the second power line; and for any two display sub-areas, a number of the first pixel units in one of the two display sub-areas closer to the first power bus is less than or equal to a number of the first pixel units in the other of the two display sub-areas farther away from the first power bus.

In some embodiments, a second power bus is further provided on the other side of the display area in the extending direction of the second power line, the second power bus is coupled to the first power bus, and the other end of the second power line is coupled to the second power bus.

In some embodiments, a third power bus is provided on one side of the display area in an extending direction of the first power line, and one end of the first power bus is coupled to one end of the third power bus; and one end of the first power line is coupled to the third power bus.

In some embodiments, a fourth power bus is provided on the other side of the display area in the extending direction of the first power line, and the other end of the first power bus is coupled to one end of the fourth power bus; and the other end of the first power line is coupled to the fourth power bus.

In some embodiments, the pixel unit further includes a storage capacitor, the storage capacitor includes a first electrode plate and a second electrode plate opposite to each other, the first electrode plate is a gate layer of the driving transistor, the second power line is in the same layer as a source layer and a drain layer of the driving transistor, and the first power line is in the same layer as the second electrode plate.

In a second aspect, an embodiment of the present disclosure provides a display substrate including a display area, the display area includes a plurality of pixel units arranged in an array, each of the plurality of pixel units includes a driving transistor, each row of pixel units is correspondingly provided with a first power line, each column of pixel units is correspondingly provided with a second power line, the driving transistor in each pixel unit is electrically coupled to the second power line corresponding to the column in which the pixel unit is located, and each second power line is electrically coupled to each first power line;

a first power bus and a second power bus are respectively provided on two sides of the display area in an extending direction of the second power line, a third power bus and a fourth power bus are respectively provided on two sides of the display area in an extending direction of the first power line, one end of the first power bus is coupled to one end of the third power bus, the other end of the first power bus is coupled to one end of the fourth power bus, one end of the second power bus is coupled to the other end of the third power bus, and the other end of the second power bus is coupled to the other end of the fourth power bus; and at least two of the first power bus, the second power bus, the third power bus, and the fourth power bus are configured to respectively a supply power supply voltage to power lines correspondingly coupled thereto, wherein power lines correspondingly coupled to the first power bus and the second power bus are the second power lines, and power lines correspondingly coupled to the third power bus and the fourth power bus are the first power lines.

In a third aspect, an embodiment of the disclosure provides an AMOLED display device including the display substrate according to any one of the above embodiments.

DETAILED DESCRIPTION

In order to enable those skilled in the art to better understand the technical solution of the present disclosure, the display substrate and the AMOLED display device provided in the present disclosure will be described in detail below with reference to the accompanying drawings.

Figure 1:
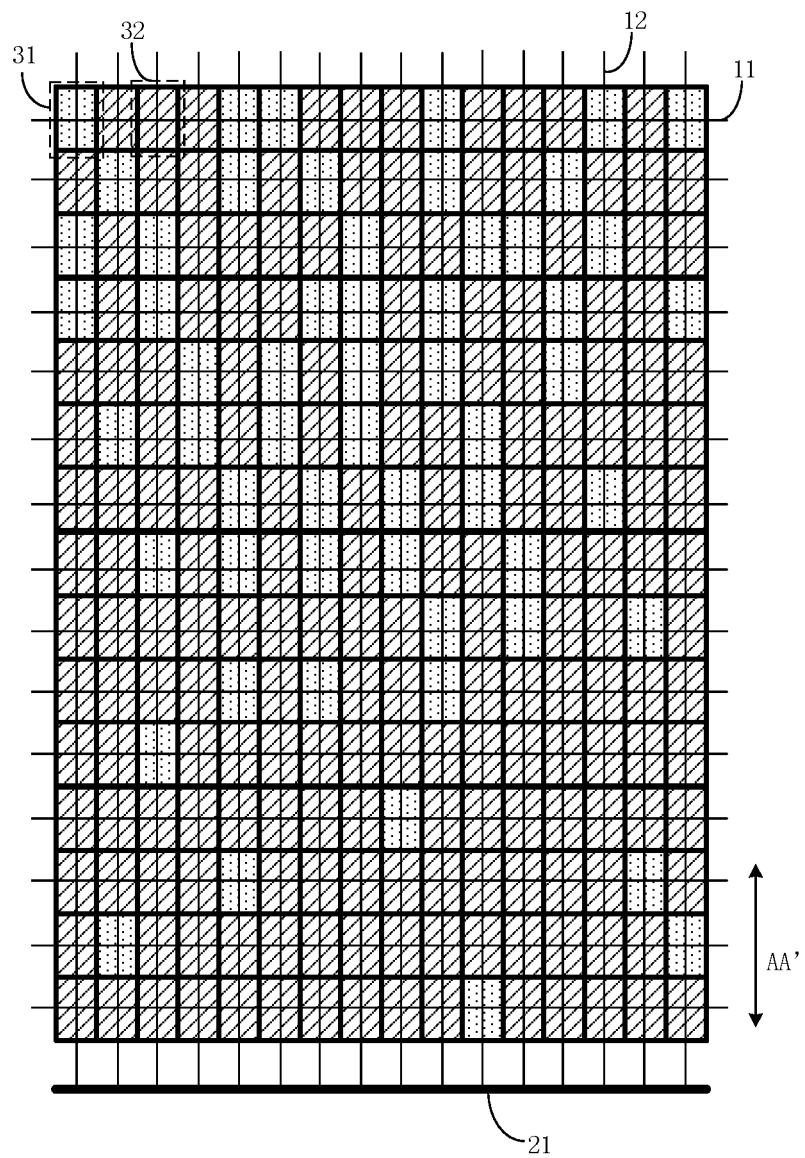
FIG. 1 is a top view of a display substrate according to an embodiment of the present disclosure.
Figure 2:
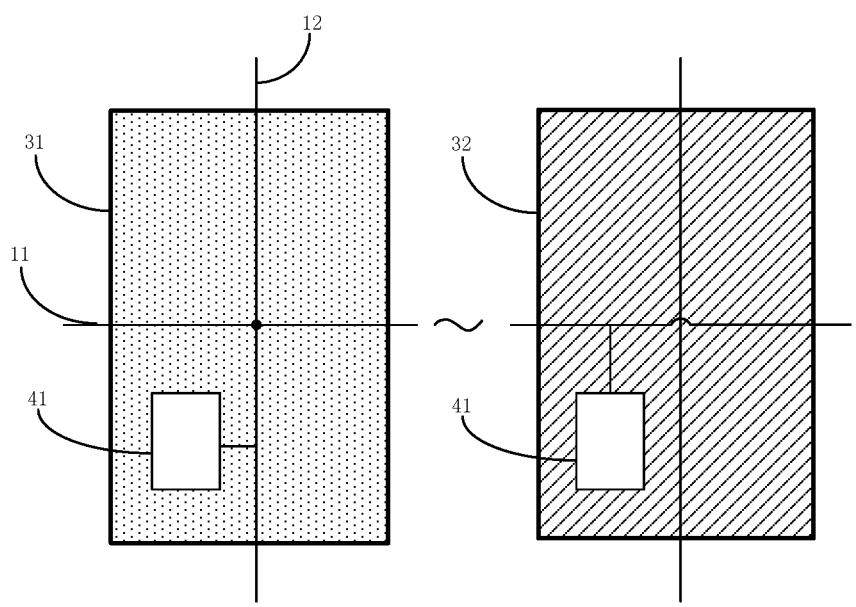
FIG. 2 is a schematic structural diagram of a first pixel unit and a second pixel unit in FIG. 1.

FIG. 1 is a top view of a display substrate according to an embodiment of the present disclosure, and FIG. 2 is a schematic structural diagram of a first pixel unit and a second pixel unit in FIG. 1. As shown in FIG. 1 and FIG. 2, the display substrate includes a display area, the display area includes a plurality of pixel units arranged in an array, each pixel unit includes a driving transistor 41, each row of pixel units is correspondingly provided with a first power line 11, and each column of pixel units is correspondingly provided with a second power line 12. A first power bus 21 is provided on one side of the display area, the one side of the display area being in an extending direction AA' of the second power line 12, and one end of the second power line 12 is coupled to the first power bus 21. The plurality of pixel units are classified into first pixel units 31 and second pixel units 32.

In each row of pixel units, there is at least one first pixel unit 31. The driving transistor 41 in each first pixel unit 31 is electrically coupled to the second power line 12 corresponding to the column in which the first pixel unit 31 is located (i.e., corresponding to the column of the first pixel unit 31).

There is at least one column of pixel units, in each of which at least one second pixel unit 32 exists. The driving transistor 41 in each second pixel unit 32 is electrically coupled to the second power line 12 corresponding to the column of any one first pixel unit 31 in the row in which the second pixel unit 32 is located (i.e., corresponding to the row of the second pixel unit 32), through the first power line 11 corresponding to the row of the second pixel unit 32.

Specifically, the driving transistor 41 in each second pixel unit 32 is electrically coupled to the first power line 11 corresponding to the row of the second pixel unit 32, and the first power line 11 corresponding to the row of the second pixel unit 32 is electrically coupled to the second power line 12 corresponding to the column of any one first pixel unit 31 in the row of the second pixel unit 32.

For example, as shown in FIG. 1 and FIG. 2, taking the pixel units located in the first row from top to bottom as an example, the first one of the pixel units from left to right is a first pixel unit 31, and the driving transistor 41 in the first pixel unit 31 is electrically coupled to the second power line 12 corresponding to the column where the first pixel unit 31 is located, i.e., the first column. Continuing to take the pixel units located in the first row from top to bottom as an example, the second one of the pixel units from left to right is a second pixel unit 32, and the driving transistor 41 in the second pixel unit 32 is electrically coupled, through the first power line 11 corresponding to the row (i.e., the first row) in which the second pixel unit 32 is located, to the second power line 12 corresponding to the column of any one first pixel unit 31 in the row (i.e., the first row).

In some embodiments, in each row of pixel units, only the second power line 12 corresponding to the column of one first pixel unit 31 is electrically coupled to the first power line 11 corresponding to the row, so that the driving transistors 41 in all of the second pixel units 32 in the row can be electrically coupled to the second power line 12 corresponding to the column of the first pixel unit 31 through the first power lines 11 corresponding to the row. For example, as shown in FIG. 1 and FIG. 2, taking the pixel units located in the first row from top to bottom as an example, the first one of the pixel units from left to right is the first pixel unit 31, only the second power line 12 corresponding to the first column in which the first one of the first pixel unit(s) 31 in the first row is located is electrically coupled to the first power line 11 corresponding to the first row, and all of the second pixel units 32 in the first row are electrically coupled to the second power line 12 corresponding to the first column in which the first one of the first pixel unit(s) 31 is located through the first power line 11 corresponding to the first row.

In some embodiments, for each row of pixel units, when the row of pixel units includes a plurality of first pixel units 31, second power lines 12 respectively corresponding to the columns in which some or all of the first pixel units 31 are located may be all electrically coupled to the first power line 11 corresponding to the row, and thus, the driving transistor 41 in each second pixel unit 32 in the row may be electrically coupled to the second power line 12 corresponding to the column of any one of the some or all of the first pixel units 31 in the row through the first power line 11 corresponding to the row. Herein, "some" may be understood as two or more.

In the embodiments of the present disclosure, the display substrate further includes a power chip (Power IC) (not shown in the figures), and the power chip is configured to provide a power supply voltage Vdd. The first power bus 21 is coupled to the power chip and is configured to transmit the power supply voltage Vdd from the power chip to the second power line 12 coupled thereto. The second power line 12 is configured to transmit the power supply voltage Vdd to the driving transistor in the first pixel unit 31 coupled thereto. The first power line 11 is configured to transmit the power supply voltage Vdd transmitted from the second power line 12 coupled thereto to the driving transistor in the second pixel unit 32 coupled thereto.

In the embodiments of the present disclosure, the display substrate further includes a non-display area located around the display area, and the first power bus 21 and the power chip are both located in the non-display area.

It should be noted that, in the embodiments of the present disclosure, the number of rows of the pixel units, the number of columns of the pixel units, the number of pixel units in each row of pixel units, and the number of pixel units in each column of pixel units in FIG. 1 are only illustrative, and the number of rows, the number of columns, and the number of pixel units in the display substrate are not particularly limited in the embodiments of the present disclosure. In addition, the distribution of the first pixel units 31 and the distribution of the second pixel units 32 in FIG. 1 are only illustrative, and the number and the distribution positions of the first pixel units 31 and the number and the distribution positions of the second pixel units 32 in each row of pixel units are not particularly limited in the embodiments of the present disclosure.

In a conventional display substrate, since the driving transistor in each pixel unit is coupled to a power line corresponding to the column of the pixel unit, a severe IR drop phenomenon occurs when a power supply voltage Vdd is transmitted through the power line from one end proximal to the power chip to the other end distal to the power chip. In the embodiments of the present disclosure, there is at least one column of pixel units, each of which includes at least one second pixel unit 32, and the driving transistor in the at least one second pixel unit 32 is not electrically coupled to the corresponding second power line 12, so that when the power supply voltage Vdd is transmitted through the corresponding second power line 12 to the position of the corresponding second pixel unit 32, the IR drop problem does not occur. As a result, the IR drop phenomenon of the display substrate is effectively alleviated, further the problem of poor uniformity of display brightness caused by the IR drop phenomenon is solved, and the uniformity of display brightness is improved.

In an embodiment of the present disclosure, the display substrate further includes a base substrate, and the plurality of pixel units arranged in an array are provided on the base substrate.

In the embodiments of the present disclosure, each pixel unit further includes an anode, and the driving transistor 41 includes a source layer, a drain layer, a gate layer, and an active layer. The source layer is coupled to the active layer through a via hole, the anode is coupled to the drain layer through a via hole, and the drain layer is coupled to the active layer through a via hole. Note that the base substrate, the anode, the source layer, the drain layer, the gate layer, and the active layer are not shown in the drawings of the embodiments of the present disclosure.

In the first pixel unit 31, the second power line 12 corresponding to the column of the first pixel unit 31 is electrically coupled to the active layer of the driving transistor 41 through a via hole. In an embodiment of the present disclosure, the active layer of each driving transistor 41 may become conductive by doping, so that when the driving transistor 41 in the first pixel unit 31 is turned on, the second power line 12 corresponding to the column of the first pixel unit 31 can transmit the power supply voltage Vdd to the anode in the first pixel unit 31 through the active layer of the driving transistor 41. In the second pixel unit 32, the first power line 11 corresponding to the row of the second pixel unit 32 is electrically coupled to the active layer of the driving transistor 41 through a via hole. The first power line 11 is electrically coupled to the second power line 12 corresponding to the column of any one of the first pixel units 31 in the row of the second pixel unit 32. Therefore, when the driving transistor 41 in the second pixel unit 32 is turned on, the second power line 12 can transmit the power supply voltage Vdd to the active layer of the driving transistor 41 in the second pixel unit 32 through the first power line 11 corresponding to the row of the second pixel unit 32, and further transmit the power supply voltage Vdd to the anode in the second pixel unit 32 through the active layer.

Figure 9:
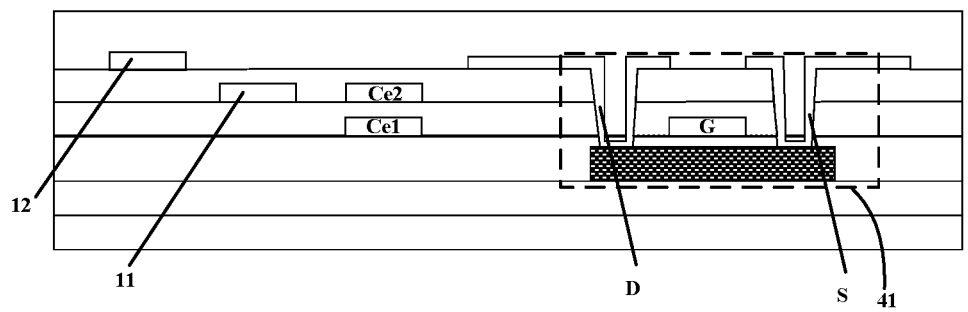
FIG. 9 is a cross-sectional view of a display substrate according to an embodiment of the present disclosure.

In the embodiments of the present disclosure, as shown in FIG. 9, the second power line 12 and the source layer S and the drain layer D of the driving transistor 41 are provided in a same layer, and the second power line 12 and the source layer S and the drain layer D of the driving transistor 41 may be formed in one patterning process.

In some embodiments, the active layer includes a channel region, a first doped region and a second doped region (not shown in the figures), and the first doped region and the second doped region are respectively located at two sides of the channel region. The first doped region and the second doped region become conductive by doping, the drain layer of the driving transistor 41 is coupled to the first doped region, and the source layer of the driving transistor 41 is coupled to the second doped region. For the first pixel unit 31, the second power line 12 corresponding to the column of the first pixel unit 31 is electrically coupled to the second doped region of the active layer of the driving transistor 41 through a via hole, and for the second pixel unit 32, the first power line 11 corresponding to the row of the second pixel unit 32 is electrically coupled to the second doped region of the active layer of the driving transistor 41 through a via hole.

In the embodiments of the present disclosure, as shown in FIG. 9, each pixel unit further includes a storage capacitor, and the storage capacitor includes a first electrode plate Ce1 and a second electrode plate Ce2. The first electrode plate Ce1 is the gate layer G of the driving transistor 41 in the pixel unit, the material of the second electrode plate Ce2 is the same as that of the gate layer G the first power line 11 and the second electrode plate Ce2 are provided in a same layer, and the first power line 11 and the second electrode plate Ce2 may be formed in one patterning process.

In an embodiment of the present disclosure, each pixel unit further includes a buffer layer, a gate insulating (GI) layer, a dielectric layer, an insulating (ILD) layer, and a planarization (PLN) layer. The buffer layer is on the base substrate, the active layer is on a side of the buffer layer distal to the base substrate, the gate insulating layer is on a side of the active layer distal to the base substrate, the gate layer is on a side of the gate insulating layer distal to the base substrate, the dielectric layer is on a side of the gate layer distal to the base substrate, the second electrode plate and the first power line 11 are on a side of the dielectric layer distal to the base substrate, the insulating layer is on a side of the second electrode plate distal to the base substrate, the source layer, the drain layer, and the second power line 12 are on a side of the insulating layer distal to the base substrate, the planarization layer is on a side of the source layer, the drain layer, and the second power line 12 distal to the base substrate, and the anode is on a side of the planarization layer distal to the base substrate. Note that the buffer layer, the gate insulating (GI) layer, the dielectric layer, the insulating (ILD) layer, and the planarization (PLN) layer are not shown in the drawings of the embodiments of the present disclosure.

In an embodiment of the present disclosure, each pixel unit further includes an organic light emitting layer (not shown in the figures) and a cathode (not shown in the figures). The organic light emitting layer is between the anode and the cathode, and the organic light emitting layer includes, but is not limited to: a hole injection layer, a hole transport layer, an electroluminescent layer, an electron injection layer and an electron transport layer (not shown in the figures).

In some embodiments, for the first pixel unit 31, the second power line 12 corresponding to the column of the first pixel unit 31 may also be electrically coupled to the source layer of the driving transistor 41. For the second pixel unit 32, the first power line 11 corresponding to the row of the second pixel unit 32 may also be electrically coupled to the source layer of the driving transistor 41 through a via hole.

The display substrate provided in the embodiments of the present disclosure may be fabricated by using a low temperature polysilicon (LTPS for short) process, and may also be fabricated by using other suitable fabricating processes, which are not particularly limited in the embodiments of the present disclosure.

Figure 3:
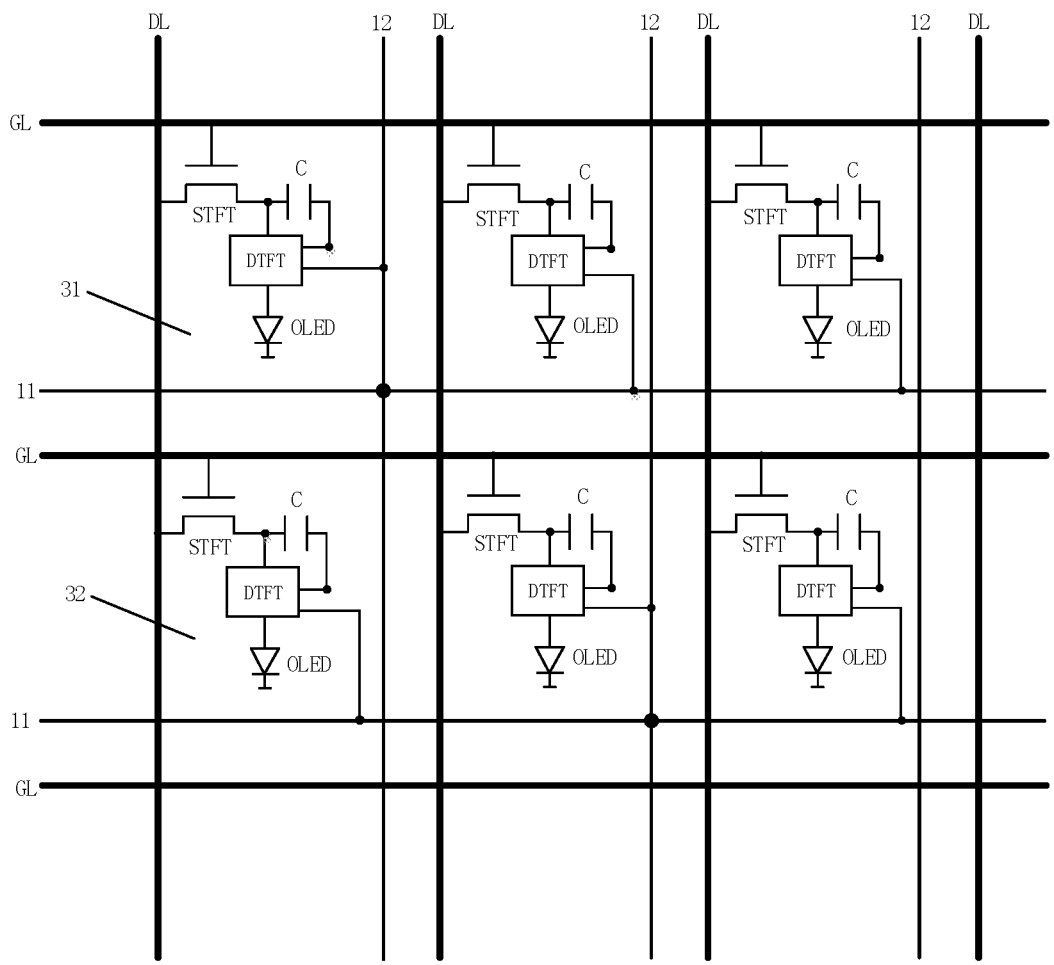
FIG. 3 is a schematic diagram of an application of a display substrate according to an embodiment of the present disclosure.

FIG. 3 is a schematic diagram of an application of a display substrate according to an embodiment of the present disclosure, and in an application scenario, a pixel circuit structure of the display substrate adopts a 2T1C structure. Referring to FIG. 1 and FIG. 3, the display substrate further includes gate lines GL and data lines DL, and the gate lines GL and the data lines DL intersect to define pixel units. The pixel unit further includes a scan transistor STFT, a control electrode of the scan transistor STFT is coupled to a corresponding gate line GL, a source electrode of the scan transistor STFT is coupled to a corresponding data line DL, and a drain electrode of the scan transistor STFT is coupled to one end of a storage capacitor C in the pixel unit and a control electrode of a driving transistor DTFT (41). The other end of the storage capacitor C is coupled to a source electrode of the driving transistor DTFT (41), and a drain electrode of the driving transistor DTFT (41) is coupled to an anode of an organic light emitting unit OLED. The organic light emitting unit OLED includes an organic light emitting layer, an anode and a cathode, the cathode being coupled to a low-level voltage Vss.

As shown in FIG. 3, each first power line 11 is coupled to the second power line 12 corresponding to the column of one of the first pixel units 31 in the row. In the first pixel unit 31, the active layer of the driving transistor DTFT (41) is coupled to the second power line 12 corresponding to the column of the first pixel unit 31; in the second pixel unit 32, the active layer of the driving transistor DTFT (41) is coupled to the first power line 11 corresponding to the row of the second pixel unit 32.

It should be noted that, in the display substrate according to the embodiments of the present disclosure, the pixel circuit structure is not limited to 2T1C structure, and may also be 3T1C, 4T1C, 5T1C, or 6T1C structure.

Figure 4:
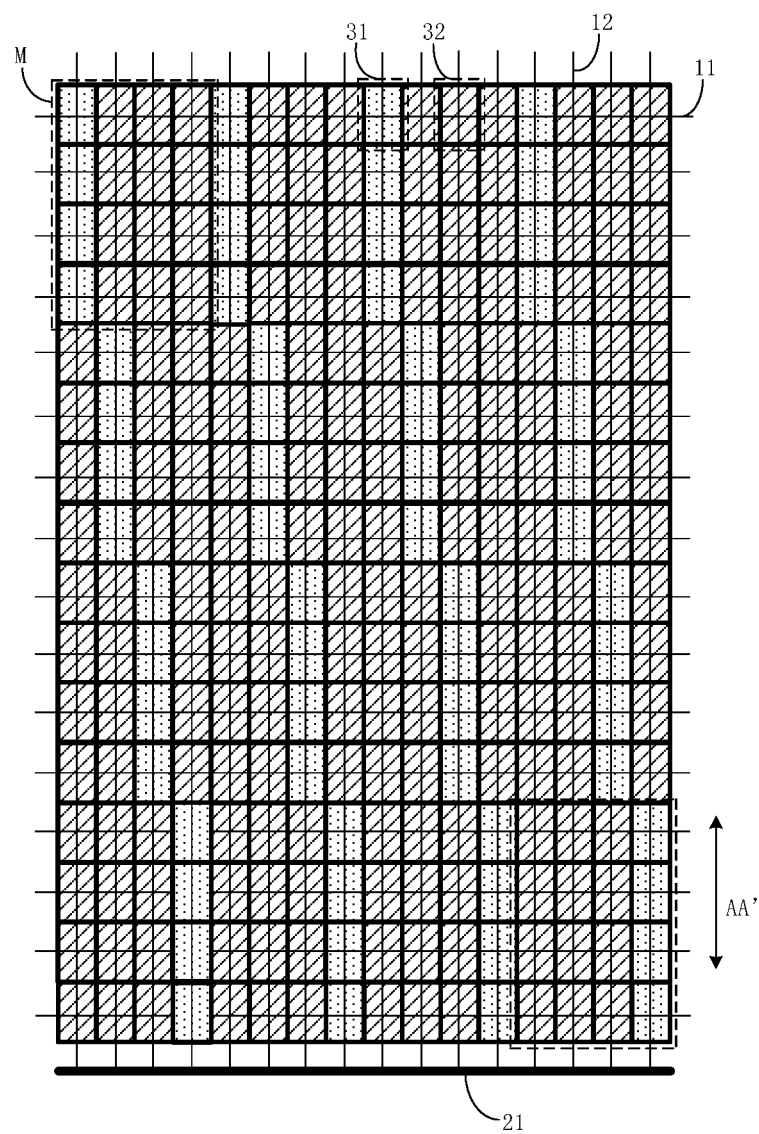
FIG. 4 is a schematic diagram of an implementation of a display substrate according to an embodiment of the present disclosure.

FIG. 4 is a schematic diagram of a specific implementation of a display substrate according to an embodiment of the present disclosure, and as shown in FIG. 4, in some embodiments, the display area is divided into a plurality of display sub-areas M arranged in an array, that is, the display area includes a plurality of display sub-areas M arranged in an array. Each display sub-area M includes a plurality of pixel units, and each display sub-area M has a same size. For example, as shown in FIG. 4, each display sub-area M includes pixel units in four rows and four columns.

In some embodiments, as shown in FIG. 4, each display sub-area M includes at least one first pixel unit 31, and the remaining pixel units are second pixel units 32.

In some embodiments, as shown in FIG. 4, in each display sub-area M, there are a plurality of first pixel units 31, and the plurality of first pixel units 31 in a same display sub-area M are located in a same column. For example, as shown in FIG. 4, each display sub-area M includes four first pixel units 31, and the four first pixel units 31 are located in a same column.

In some embodiments, as shown in FIG. 4, the number of the plurality of first pixel units 31 in each display sub-area M is the same. For example, as shown in FIG. 4, each display sub-area M includes four first pixel units 31.

In some embodiments, the first pixel units 31 in different display sub-areas M are located in different columns. For example, as shown in FIG. 4, from top to bottom, the first pixel units 31 in the first one of the display sub-areas M and the first pixel units 31 in the adjacent display sub-area M are located in different columns.

In some embodiments, with the arrangement of the first pixel units 31 and the second pixel units 32 in the display substrate as shown in FIG. 4, on one hand, the IR drop phenomenon of each display sub-area M can be effectively alleviated, and on the other hand, the IR drop phenomenon of each display sub-area M can be more uniform, so that the uniformity of the display brightness of each display sub-area M can be effectively improved.

Figure 5:
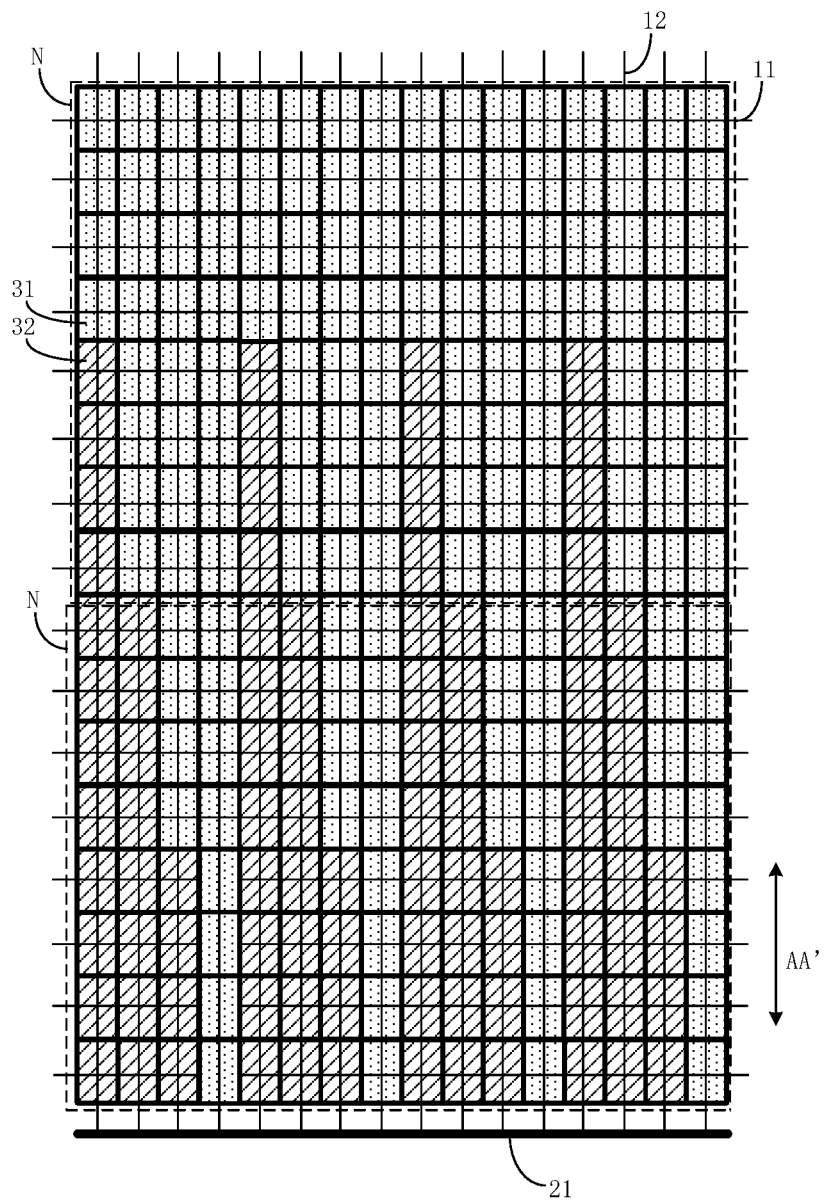
FIG. 5 is a schematic diagram of another implementation of a display substrate according to an embodiment of the present disclosure.

FIG. 5 is a schematic diagram of another specific implementation of a display substrate according to an embodiment of the present disclosure. As shown in FIG. 5, in some embodiments, the display area includes at least two display sub-areas N, and the at least two display sub-areas N are disposed along the extending direction AA' of the second power line 12. That is, along the extending direction AA' of the second power line 12, the display area is divided into at least two display sub-areas N, and each display sub-area N has a same size. For example, as shown in FIG. 5, the display area includes two display sub-areas N, each of which includes pixel units in eight rows and eight columns.

In some embodiments, for any two display sub-areas N, the number of first pixel units 31 in the display sub-area N that is closer to the first power bus 21 is less than or equal to the number of first pixel units 31 in the display sub-area N that is farther away from the first power bus 21.

Generally, the IR drop phenomenon in the display sub-area N farther away from the first power bus 21 is more serious than the IR drop phenomenon in the display sub-area N closer to the first power bus 21, and therefore, in some embodiments, the number of the first pixel units 31 in the display sub-area N closer to the first power bus 21 is set to be less than or equal to the number of the first pixel units 31 in the display sub-area N farther away from the first power bus 21. On one hand, the IR drop phenomenon in the display sub-area N farther away from the first power bus 21 can be effectively alleviated, and on the other hand, the IR drop phenomenon in the display sub-area N farther away from the first power bus 21 and the IR drop phenomenon of the display sub-area N closer to the first power bus 21 can be more uniform, thereby effectively improving the uniformity of the display brightness of the display substrate.

The display substrate provided by the embodiments of the disclosure has at least one column of pixel units, each of which includes at least one second pixel unit, and the driving transistor in the at least one second pixel unit 32 is not electrically coupled to the corresponding second power line 12, so that when the power supply voltage Vdd is transmitted through the corresponding second power line 12 to the position of the corresponding second pixel unit 32, the IR drop problem does not occur. As a result, the IR drop phenomenon of the display substrate is effectively alleviated, further the problem of poor uniformity of display brightness caused by the IR drop phenomenon is solved, and the uniformity of display brightness is improved.

Figure 6:
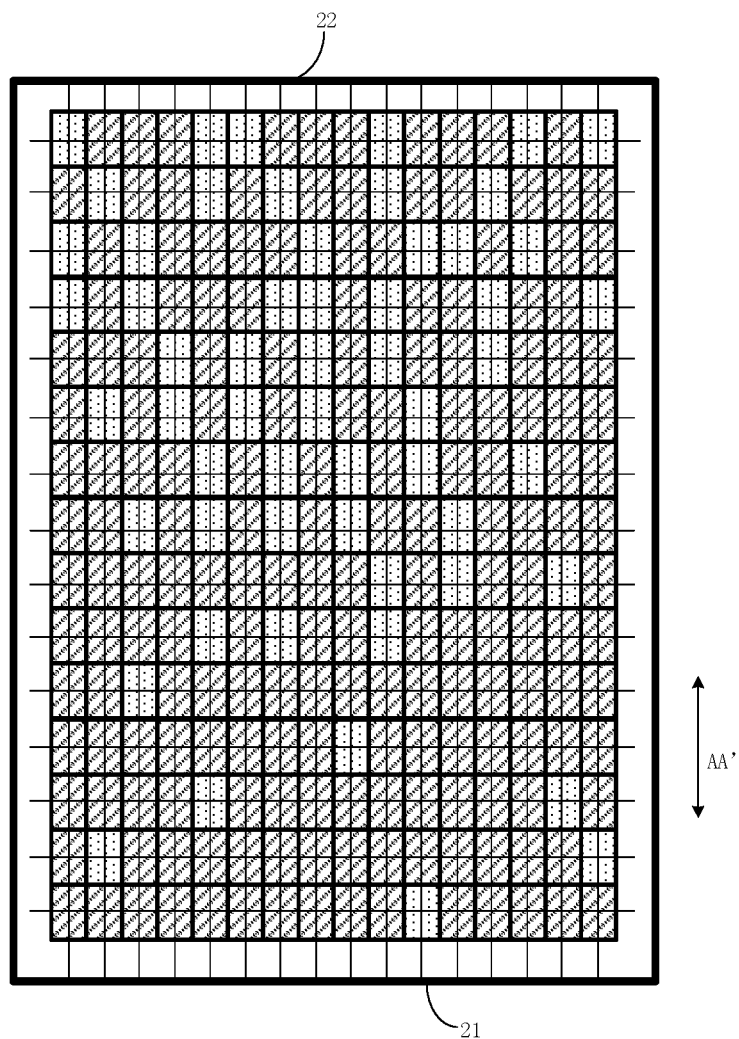
FIG. 6 is a top view of another display substrate according to an embodiment of the present disclosure.

FIG. 6 is a top view of another display substrate according to an embodiment of the present disclosure. The display substrate according to the embodiment of the present disclosure is different from the display substrate according to any one of the embodiments described above in that: referring to FIG. 1 and FIG. 6, in this embodiment of the present disclosure, a second power bus 22 is further provided on the other side of the display area, the other side of the display area being also in the extending direction AA' of the second power line 12, the second power bus 22 is coupled to the first power bus 21, and the other end of the second power line 12 is coupled to the second power bus 22.

Compared with the display substrate according to any one of the above embodiments, in this embodiment of the present disclosure, by respectively providing the first power bus 21 and the second power bus 22 on two sides of the display area, the two sides of the display area being in the extending direction AA' of the second power line 12, the power supply voltage Vdd can be simultaneously applied to two ends of the second power line 12, so as to further alleviate the IR drop phenomenon of the display substrate.

In addition, for other specific descriptions of the display substrate according to this embodiment of the present disclosure, reference may be made to the description in any of the above embodiments, and details are not repeated herein.

Figure 7:
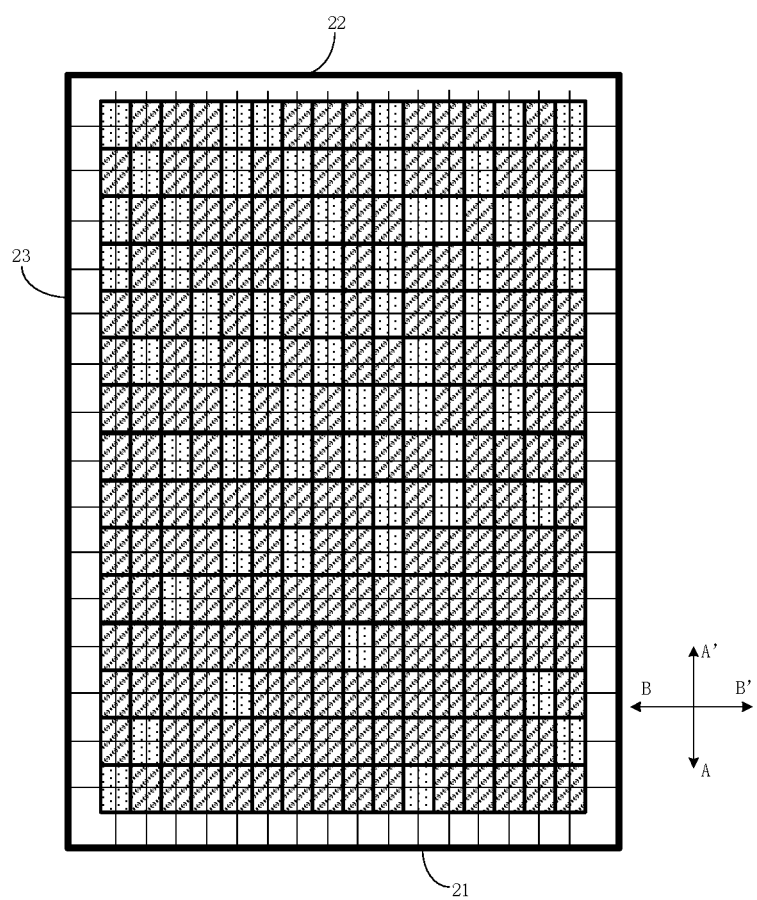
FIG. 7 is a top view of yet another display substrate according to an embodiment of the present disclosure.

FIG. 7 is a top view of another display substrate according to an embodiment of the present disclosure, and as shown in FIG. 7, the display substrate according to this embodiment of the present disclosure is different from the display substrate according to any one of the embodiments described above in that: referring to FIG. 1 and FIG. 7, in this embodiment of the present disclosure, a third power bus 23 is provided on one side of the display area, the one side of the display area being in an extending direction BB' of the first power line 11, and one end of the first power bus 21 is coupled to one end of the third power bus 23; one end of the first power line 11 is coupled to the third power bus 23.

In some embodiments, a fourth power bus 24 is provided on the other side of the display area, the other side of the display area being in the extending direction BB' of the first power line 11, and the other end of the first power bus 21 is coupled to one end of the fourth power bus 24; the other end of the first power line 11 is coupled to the fourth power bus 24.

Compared with the display substrate according to any of the above embodiments, in this embodiment of the present disclosure, on the basis of supplying the power supply voltage Vdd from the first power bus 21 to the second power line 12, the third power bus 23 and the fourth power bus 24 are respectively provided on other two sides of the display area, other two sides of the display area being in the extending direction AA' of the first power line 11, so that the power supply voltage Vdd can be supplied to two ends of the first power line 11 at the same time, and thus the IR drop phenomenon of the display substrate can be further alleviated.

In addition, for other specific descriptions of the display substrate according to this embodiment of the present disclosure, reference may be made to the description in any of the above embodiments, and details are not repeated herein.

Figure 8:
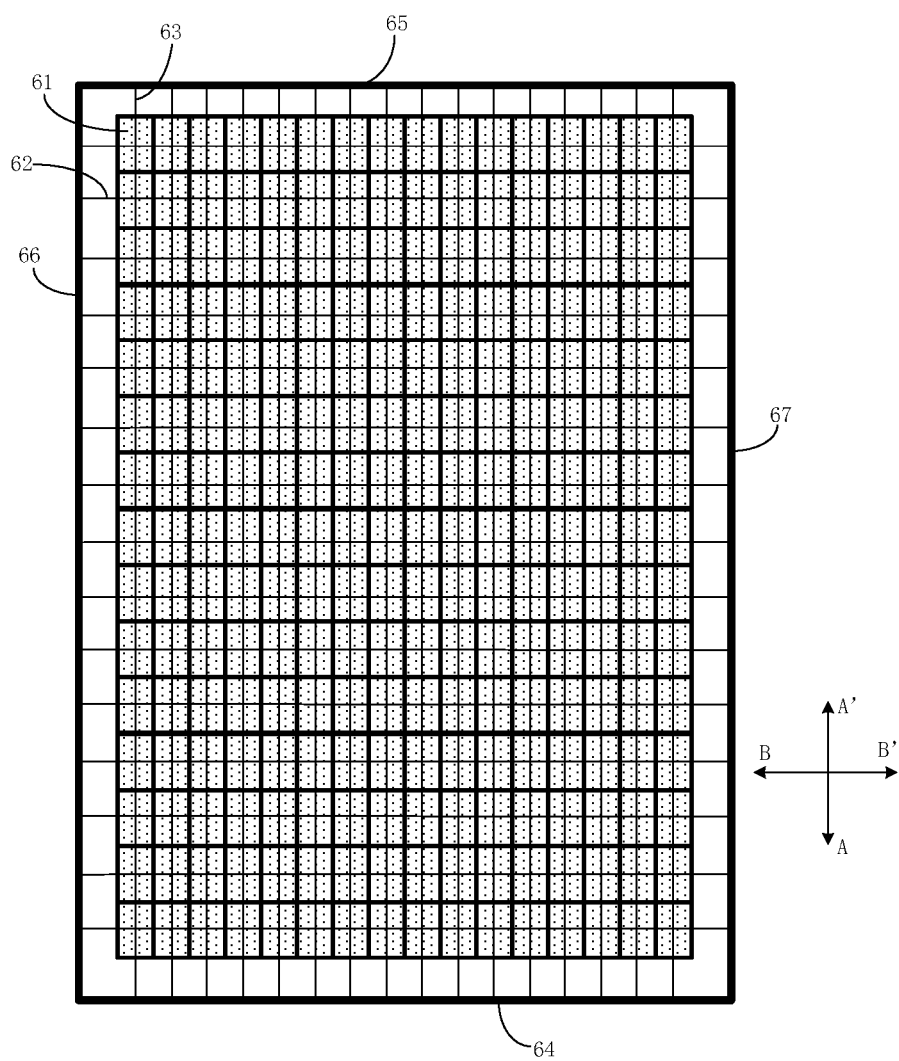
FIG. 8 is a top view of another display substrate according to an embodiment of the present disclosure.

FIG. 8 is a top view of another display substrate according to an embodiment of the present disclosure. As shown in FIG. 8, in this embodiment of the present disclosure, the display substrate includes a display area, the display area includes a plurality of pixel units 61 arranged in an array, each pixel unit 61 includes a driving transistor, each row of pixel units 61 is correspondingly provided with a first power line 62, each column of pixel units 61 is correspondingly provided with a second power line 63, the driving transistor in each pixel unit 61 is electrically coupled to the second power line 63 corresponding to the column of the pixel unit 61, and each second power line 63 is electrically coupled to each first power line 62.

A first power bus 64 and a second power bus 65 are respectively provided on two sides of the display area, the two sides of the display area being in an extending direction AA' of the second power line 63, a third power bus 66 and a fourth power bus 67 are respectively provided on other two sides of the display area, the other two sides of the display area being in an extending direction BB' of the first power line 62, one end of the first power bus 64 is coupled to one end of the third power bus 66, the other end of the first power bus 64 is coupled to one end of the fourth power bus 67, one end of the second power bus 65 is coupled to the other end of the third power bus 66, and the other end of the second power bus 65 is coupled to the other end of the fourth power bus 67.

At least two of the first power bus 64, the second power bus 65, the third power bus 66, and the fourth power bus 67 are respectively used for transmitting power supply voltages to power lines correspondingly coupled thereto. The power lines correspondingly coupled to the first power bus 64 and the second power bus 65 are the second power lines 63, and the power lines correspondingly coupled to the third power bus 66 and the fourth power bus 67 are the first power lines 62. For example, the first power bus 64 and the second power bus 65 are respectively configured to transmit the power supply voltage Vdd to the second power lines 63 correspondingly coupled thereto, and both the third power bus 66 and the fourth power bus 67 are not coupled to the first power lines 62, and only serve as connection lines between the first power bus 64 and the second power bus 65. For example, the first power bus 64 is used for transmitting the power supply voltage Vdd to the second power lines 63 correspondingly coupled thereto, the third power bus 66 and the fourth power bus 67 are respectively used for transmitting the power supply voltage Vdd to the first power lines 62 correspondingly coupled thereto, and the second power bus 65 is not coupled to the second power lines 63 and only serves as a connection line between the third power bus 66 and the fourth power bus 67. For example, as shown in FIG. 8, the first power bus 64 and the second power bus 65 are respectively used for transmitting the power supply voltage Vdd to the second power lines 63 correspondingly coupled thereto, and the third power bus 66 and the fourth power bus 67 are respectively used for transmitting the power supply voltage Vdd to the first power lines 62 correspondingly coupled thereto.

In this embodiment of the present disclosure, the display substrate further includes a power chip (Power IC) (not shown in the figures), which is coupled to any one of the first power bus 64, the second power bus 65, the third power bus 66 and the fourth power bus 67, and is configured to provide a power supply voltage Vdd to any one of the first power bus 64, the second power bus 65, the third power bus 66 and the fourth power bus 67.

In this embodiment of the disclosure, the power supply voltage Vdd is supplied to the pixel units of the display substrate from at least two sides of the display substrate, so that the supply capacity of the power supply voltage Vdd is increased, and the IR drop phenomenon of the display substrate is effectively alleviated.

In addition, for other relevant descriptions of the display substrate according to this embodiment of the present disclosure, reference may be made to the description of the above embodiments, and details are not repeated herein.

An embodiment of the disclosure further provides an AMOLED display device, which includes the display substrate according to any one of the above embodiments. For a detailed description of the display substrate, reference may be made to the description of the display substrate in any of the above embodiments, and details are not repeated herein.

It is to be understood that the above implementations are merely exemplary implementations employed to explain the principles of the present disclosure, but the present disclosure is not limited thereto. Various modifications and improvements can be made by those skilled in the art without departing from the spirit and scope of the present disclosure, and such modifications and improvements are also considered to be within the protection scope of the present disclosure.

What is claimed is:

1. A display substrate, comprising a display area, wherein the display area comprises a plurality of pixel units arranged in an array, each of the plurality of pixel units comprises a driving transistor, each row of pixel units is correspondingly provided with a first power line, and each column of pixel units is correspondingly provided with a second power line; a first power bus is provided on one side of the display area in an extending direction of the second power line, and one end of the second power line is coupled to the first power bus; the plurality of pixel units are divided into a first pixel unit and a second pixel unit;

each row of pixel units comprises at least one first pixel unit; the driving transistor in the first pixel unit is electrically and directly coupled to the second power line corresponding to a column in which the first pixel unit is located, but is not directly coupled to the first power line corresponding to a row in which the first pixel unit is located; and for at least one column of pixel units, each column of the at least one column comprises at least one second pixel unit; the driving transistor in the second pixel unit is electrically coupled, through the first power line corresponding to a row in which the second pixel unit is located, to the second power line corresponding to a column in which any one first pixel unit in the same row as the second pixel unit is located; the driving transistor in the second pixel unit is electrically and directly coupled to the first power line corresponding to the row in which the second pixel unit is located, but is not directly coupled to the second power line corresponding to the column in which any one first pixel unit in the same row as the second pixel unit is located.

2. The display substrate of claim 1, wherein in the first pixel unit, an active layer of the driving transistor is electrically coupled to the second power line corresponding to the column in which the first pixel unit is located.

3. The display substrate of claim 1, wherein in the second pixel unit, an active layer of the driving transistor is electrically coupled, through the first power line corresponding to the row in which the second pixel unit is located, to the second power line corresponding to the column in which any one first pixel unit in the same row as the second pixel unit is located.

4. The display substrate of claim 1, wherein the display area comprises a plurality of display sub-areas arranged in an array, and each of the plurality of display sub-areas comprises at least one first pixel unit.

5. The display substrate of claim 4, wherein each of the plurality of display sub-areas comprises a plurality of first pixel units, and the plurality of first pixel units located in a same display sub-area are located in a same column.

6. The display substrate of claim 5, wherein a number of the plurality of first pixel units in each of the plurality of display sub-areas is the same.

7. The display substrate of claim 6, wherein the first pixel units in different display sub-areas are located in different columns.

8. The display substrate of claim 1, wherein the display area comprises at least two display sub-areas, and the at least two display sub-areas are disposed along the extending direction of the second power line; and for any two display sub-areas, a number of the first pixel units in one of the two display sub-areas closer to the first power bus is less than or equal to a number of the first pixel units in the other of the two display sub-areas farther away from the first power bus.

9. The display substrate of claim 1, wherein a second power bus is further provided on the other side of the display area in the extending direction of the second power line, the second power bus is coupled to the first power bus, and the other end of the second power line is coupled to the second power bus.

10. The display substrate of claim 1, wherein a third power bus is provided on one side of the display area in an extending direction of the first power line, and one end of the first power bus is coupled to one end of the third power bus; and one end of the first power line is coupled to the third power bus.

11. The display substrate of claim 10, wherein a fourth power bus is provided on the other side of the display area in the extending direction of the first power line, and the other end of the first power bus is coupled to one end of the fourth power bus; and the other end of the first power line is coupled to the fourth power bus.

12. The display substrate of claim 1, wherein the pixel unit further comprises a storage capacitor, the storage capacitor comprises a first electrode plate and a second electrode plate opposite to each other, the first electrode plate is a gate layer of the driving transistor, the second power line is in the same layer as a source layer and a drain layer of the driving transistor, and the first power line is in the same layer as the second electrode plate.

13. An AMOLED display device, comprising the display substrate of claim 1.

14. A display substrate, comprising a display area, wherein the display area comprises a plurality of pixel units arranged in an array, each of the plurality of pixel units comprises a driving transistor, each row of pixel units is correspondingly provided with a first power line, each column of pixel units is correspondingly provided with a second power line, the driving transistor in each pixel unit is electrically coupled to the second power line corresponding to a column in which the pixel unit is located, and each second power line is electrically coupled to each first power line;

a first power bus and a second power bus are respectively provided on two sides of the display area in an extending direction of the second power line, a third power bus and a fourth power bus are respectively provided on two sides of the display area in an extending direction of the first power line, one end of the first power bus is coupled to one end of the third power bus, the other end of the first power bus is coupled to one end of the fourth power bus, one end of the second power bus is coupled to the other end of the third power bus, and the other end of the second power bus is coupled to the other end of the fourth power bus; and at least two of the first power bus, the second power bus, the third power bus, and the fourth power bus are configured to respectively supply a power supply voltage to power lines correspondingly coupled thereto, wherein power lines correspondingly coupled to the first power bus and the second power bus are the second power lines, and power lines correspondingly coupled to the third power bus and the fourth power bus are the first power lines, wherein the plurality of pixel units are divided into a first pixel unit and a second pixel unit;

each row of pixel units comprises at least one first pixel unit the driving transistor in the first pixel unit is electrically and directly coupled to the second power line corresponding to a column in which the first pixel unit is located, but is not directly coupled to the first power line corresponding to a row in which the first pixel unit is located; and for at least one column of pixel units, each column of the at least one column comprises at least one second pixel unit the driving transistor in the second pixel unit is electrically coupled, through the first power line corresponding to a row in which the second pixel unit is located, to the second power line corresponding to a column in which any one first pixel unit in the same row as the second pixel unit is located; the driving transistor in the second pixel unit is electrically and directly coupled to the first power line corresponding to the row in which the second pixel unit is located, but is not directly coupled to the second power line corresponding to the column in which any one first pixel unit in the same row as the second pixel unit is located.

15. An AMOLED display device, comprising the display substrate of claim 14.

* * * * *